(12) United States Patent
Chen et al.

(10) Patent No.: US 9,275,839 B2
(45) Date of Patent: Mar. 1, 2016

(54) TOROIDAL PLASMA CHAMBER FOR HIGH GAS FLOW RATE PROCESS

(75) Inventors: Xing Chen, Lexington, MA (US); Andrew Cowe, Andover, MA (US)

(73) Assignee: MKS Instruments, Inc., Andover, MA (US)

( * ) Notice: Subject to any disclaimer, the term of this patent is extended or adjusted under 35 U.S.C. 154(b) by 680 days.

(21) Appl. No.: 12/738,314

(22) PCT Filed: Oct. 19, 2007

(86) PCT No.: PCT/US2007/081875
§ 371 (c)(1),
(2), (4) Date: Apr. 16, 2010

(87) PCT Pub. No.: WO2009/051597
PCT Pub. Date: Apr. 23, 2009

(65) Prior Publication Data
US 2010/0206847 A1    Aug. 19, 2010

(51) Int. Cl.
*H01J 37/32*    (2006.01)

(52) U.S. Cl.
CPC ....... *H01J 37/32357* (2013.01); *H01J 37/3244* (2013.01); *H01J 37/32449* (2013.01)

(58) Field of Classification Search
CPC ............ H01J 37/3244; H01J 37/32449; H01J 37/32357; C23C 16/45563; C23C 16/45565; C23C 16/45568
See application file for complete search history.

(56) References Cited

U.S. PATENT DOCUMENTS

| | | | | |
|---|---|---|---|---|
| 5,349,154 A | * | 9/1994 | Harker et al. | 117/102 |
| 5,478,608 A | * | 12/1995 | Gorokhovsky | 427/571 |
| 5,587,207 A | * | 12/1996 | Gorokhovsky | 427/571 |
| 6,150,628 A | | 11/2000 | Smith et al. | |
| 7,550,381 B2 | | 6/2009 | Lu et al. | |
| 7,861,668 B2 | | 1/2011 | Toyoda | |
| 2002/0008480 A1 | * | 1/2002 | Yamazaki et al. | 315/111.21 |
| 2002/0046991 A1 | * | 4/2002 | Smith et al. | 219/121.57 |
| 2003/0079686 A1 | * | 5/2003 | Chen et al. | 118/715 |
| 2004/0206730 A1 | * | 10/2004 | Holber et al. | 219/121.52 |
| 2005/0000655 A1 | * | 1/2005 | Wi | 156/345.48 |
| 2005/0100669 A1 | * | 5/2005 | Kools et al. | 427/255.23 |

(Continued)

FOREIGN PATENT DOCUMENTS

| | | | |
|---|---|---|---|
| JP | 07254496 A | * | 10/1995 |
| JP | 09055372 A | * | 2/1997 |

(Continued)

OTHER PUBLICATIONS

International Search Report for International Application No. PCT/US2007/081875.

*Primary Examiner* — Jeffrie R Lund
*Assistant Examiner* — Yuechuan Yu
(74) *Attorney, Agent, or Firm* — Proskauer Rose LLP

(57) ABSTRACT

A plasma chamber for activating a process gas, including at least four legs forming a toroidal plasma channel, each leg having a cross-sectional area, and an outlet formed on one leg, the outlet having a greater cross-sectional area than the cross-sectional area of the other legs. The plasma chamber further includes an inlet for receiving the process gas and a plenum for introducing the process gas over a broad area of the leg opposing the outlet to reduce localized high plasma impedance and gas flow instability, wherein the leg opposing the outlet defines a plurality of holes for providing a helical gas rotation in the plasma channel.

13 Claims, 10 Drawing Sheets

(56) References Cited

U.S. PATENT DOCUMENTS

| | | |
|---|---|---|
| 2006/0118240 A1* | 6/2006 | Holber et al. ............ 156/345.29 |
| 2006/0197037 A1* | 9/2006 | Purser et al. ............. 250/492.21 |
| 2007/0003698 A1 | 1/2007 | Chen et al. |
| 2007/0012563 A1* | 1/2007 | Wi ........................... 204/298.25 |
| 2007/0015360 A1 | 1/2007 | Lu et al. |
| 2007/0079935 A1 | 4/2007 | Schuss et al. ............ 156/345.37 |
| 2007/0119370 A1* | 5/2007 | Ma et al. .................... 118/723 E |
| 2007/0245962 A1* | 10/2007 | Choi ........................... 118/723 I |
| 2007/0245963 A1* | 10/2007 | Choi ........................... 118/723 I |
| 2007/0274893 A1 | 11/2007 | Wright et al. |

FOREIGN PATENT DOCUMENTS

| | | | |
|---|---|---|---|
| JP | 2004047192 A | * | 2/2004 |
| KR | 2004-79559 | | 9/2004 |
| RU | 2209532 C2 | * | 7/2003 |
| WO | WO 2004023853 A1 | * | 3/2004 |
| WO | WO 2006/037991 | | 4/2006 |

* cited by examiner

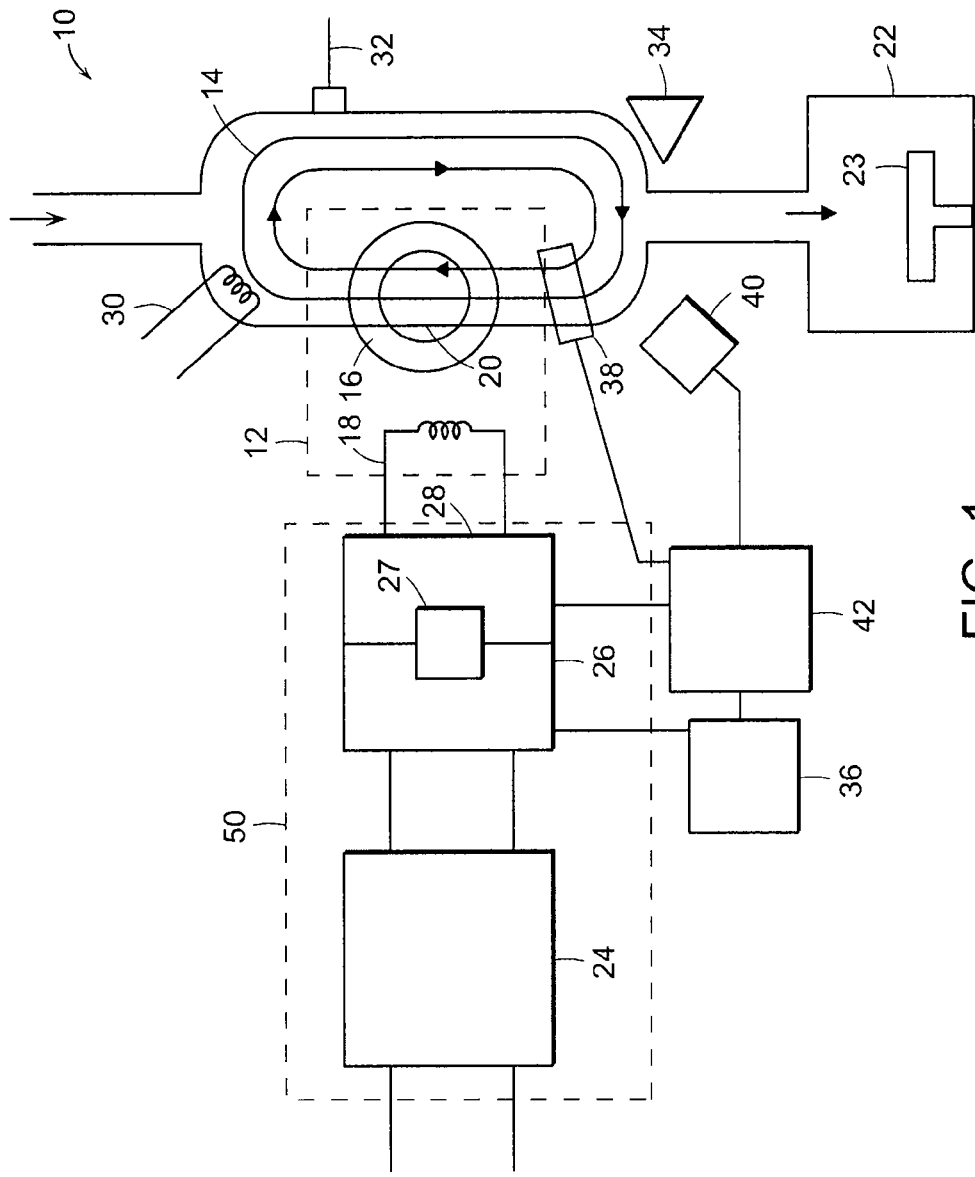
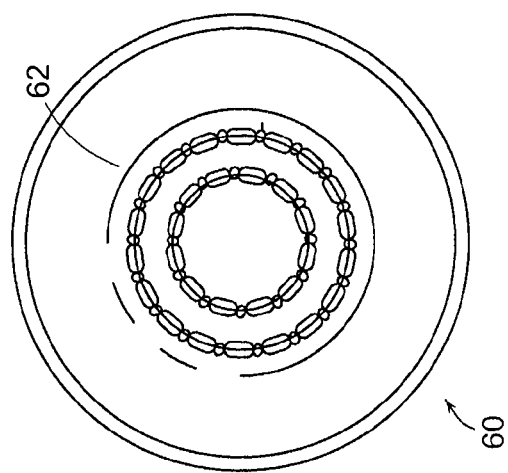
FIG. 1
FIG. 2

TOROIDAL PLASMA CHAMBER FOR HIGH GAS FLOW RATE PROCESS

CROSS-REFERENCE TO RELATED APPLICATION

This application claims the benefit of and priority to International patent application no. PCT/US2007/081875, filed on Oct. 19, 2007. The disclosure of the above-identified application is incorporated herein by reference in its entirety.

BACKGROUND

Plasma discharges can be used to excite gases to produce activated gases containing ions, free radicals, atoms and molecules. Activated gases are used for numerous industrial and scientific applications including processing solid materials such as semiconductor wafers, powders, and other gases. The parameters of the plasma and the conditions of the exposure of the plasma to the material being processed vary widely depending on the application.

For example, some applications require the use of ions with low kinetic energy (i.e. a few electron volts) because the material being processed is sensitive to damage. Other applications, such as anisotropic etching or planarized dielectric deposition, require the use of ions with high kinetic energy. Still other applications, such as reactive ion beam etching, require precise control of the ion energy.

Some applications require direct exposure of the material being processed to a high density plasma. One such application is generating ion-activated chemical reactions. Other such applications include etching of and depositing material into high aspect ratio structures. Other applications require neutral activated gases containing atoms and activated molecules while the material being processed is shielded from the plasma because the material is sensitive to damage caused by ions or because the process has high selectivity requirements.

Various plasma sources can generate plasmas in numerous ways including DC discharge, radio frequency (RF) discharge, and microwave discharge. DC discharges are achieved by applying a potential between two electrodes in a gas. RF discharges are achieved either by electrostatically or inductively coupling energy from a power supply into a plasma. Parallel plates are typically used for electrostatically coupling energy into a plasma. Induction coils are typically used for inducing current into the plasma. Microwave discharges are achieved by directly coupling microwave energy through a microwave passing window into a discharge chamber containing a gas. Microwave discharges can be used to support a wide range of discharge conditions, including highly ionized electron cyclotron resonant (ECR) plasmas.

Compared with microwave or other types of RF plasma sources, a toroidal plasma source has advantages in low electric field, low plasma chamber erosion, compactness, and cost effectiveness. The toroidal plasma source operates with a low electric field and inherently eliminates current-terminating electrodes and the associated cathode potential drop. The lower plasma chamber erosion allows toroidal plasma sources to operate at higher power densities than other types of plasma sources. In addition, the use of high permeability magnetic cores couples electromagnetic energy to plasma efficiently, allowing the toroidal plasma source to operate at relatively low RF frequencies while lowering power supply costs. Toroidal plasma sources have been used to produce chemically reactive atomic gases including fluorine, oxygen, hydrogen, nitrogen, etc. for processing semiconductor wafers, flat panel displays, and various materials.

SUMMARY

No existing toroidal plasma source can operate at NF3 flow rate of above 24 standard liters per minute (slm). There are increasing demands for high power, high gas-flow-rate plasma sources to increase throughput in plasma processing, particularly in manufacturing of flat panel displays and solar panels. The gas flow rates required by these applications can be tens to hundreds slm. At such high flow rates, flow dynamics and gas flow patterns strongly affect gas-plasma interaction or dissociation rate of the process gas as well as the stability of the plasma.

Techniques have been developed to control gas flow to improve plasma stability and to increase gas-plasma interaction. However, in existing plasma source designs process gases are introduced into a plasma channel either through a single gas injection hole or multiple holes located in a small area in the plasma channel creating high plasma impedance near the gas injecting point. The localized gas concentration and high flow speeds cause flow instabilities and limits the amount of gases that can be processed through a plasma source.

The embodiments described herein provide an apparatus and a method for reducing localized high plasma impedance and gas flow instability in a plasma channel.

The apparatus consists of a plasma chamber for use with a reactive gas source, including at least four legs forming a toroidal plasma channel, each leg having a cross-sectional area, and an outlet formed on one leg, the outlet having a greater cross-sectional area than the cross-sectional area of the other legs to accommodate increased gas flow due to dissociation of inlet gas by the plasma. The plasma chamber further includes an inlet for receiving the process gas and a plenum for introducing the process gas over a broad area along the toroidal plasma channel to reduce localized high plasma impedance and gas flow instability. In one embodiment, the plenum introduces the process gas along the plasma channel leg opposing the outlet, via a plurality of holes for providing a helical gas rotation in the plasma channel.

In one embodiment, the holes can be substantially tangential to the plasma channel inner surfaces and are angled or oriented to create a helical gas rotation in the plasma channel. The holes can be angled between 30 degrees and 90 degrees relative to an axial direction of the plasma channel leg, and between 45 degrees and 90 degrees relative to a direction perpendicular to the axis of the plasma channel leg. In one embodiment, two separate but coherent gas rotations are introduced during gas injection to improve gas-plasma interactions and to maintain flow stability.

In one embodiment, the plasma chamber can further include at least one ignition device to initiate plasma discharge. The ignition device can be located between the plenum and the leg opposing the outlet, recessed from the plasma channel through a tube section, and with a purge hole in the tube section for assisting with ignition of the plasma.

In one embodiment, a transition angle between the vertical legs of the plasma channel and the outlet can be greater than 95 degrees. The transition angle can range between 100 and 180 degrees for minimizing flow turbulence.

In one embodiment, the plasma channel can be smoothed to prevent flow turbulence, pressure build-up, or interaction of plasma with walls of the plasma channel. The NF3 flow capability of the plasma chamber can be at least 30 slm.

A buffer for introducing a process gas to a plasma chamber can include an inlet for receiving the process gas and a plenum for introducing the process gas over a broad area of the plasma channel to reduce localized high plasma impedance and gas flow instability in the plasma channel. The plenum can define a plurality of holes for providing a helical gas rotation in the plasma channel. The holes can be substantially tangential to the plasma channel inner surfaces and are angled or oriented to create a helical gas rotation in the plasma channel. The holes can be angled between 30 degrees and 90 degrees relative to the axial direction of the plasma channel leg, and between 45 degrees and 90 degrees relative to the direction perpendicular to the axis of the plasma channel leg. A method for introducing a process gas into a plasma chamber includes introducing the process gas over a broad area of a plasma channel and creating a helical gas rotation in the plasma channel to reduce localized high plasma impedance and gas flow instability in the plasma channel. The method further includes providing at least two separate but coherent gas rotations during gas introduction to improve gas-plasma interactions and to maintain flow stability. The method further includes outputting the gas at an outlet location having a cross-section area greater than the cross-sectional area of the plasma channel to prevent flow turbulence near the outlet location.

A plasma chamber for use with a reactive gas source, including means for forming at least four legs to form a toroidal plasma channel, each leg having a cross-sectional area and means for forming an outlet on one leg, the outlet having a greater cross-sectional area than the cross-sectional area of the other legs. The plasma chamber further includes means for receiving a process gas and means for introducing the process gas over a broad area of the leg opposing the outlet to reduce localized high plasma impedance and gas flow instability, wherein the leg opposing the outlet defines a plurality of holes for providing a helical gas rotation in the plasma channel.

The embodiments described herein provide the following advantages over the prior art. The plasma source can generate high flow rates of activated gases used for etching, thin film deposition and chamber clean. The plasma source can be used to abate harmful or undesirable gases. The plasma source expands the operational capability of toroidal plasma sources thereby enabling users to achieve higher process throughput and lower process cost. The plasma source can operate at high gas flow rates and achieve high gas excitation or dissociation rate. The plasma source can extend the NF3 flow capability of toroidal plasma source to 30 slm or higher.

BRIEF DESCRIPTION OF THE DRAWINGS

The foregoing and other objects, features and advantages will be apparent from the following more particular description of the embodiments, as illustrated in the accompanying drawings in which like reference characters refer to the same parts throughout the different views. The drawings are not necessarily to scale, emphasis instead being placed upon illustrating the principles of the embodiments.

FIG. 1 is a schematic representation of a toroidal low-field plasma source for producing activated gases;

FIG. 2 illustrates of an embodiment of a swirl gas mixing device;

DETAILED DESCRIPTION

Figure 3:
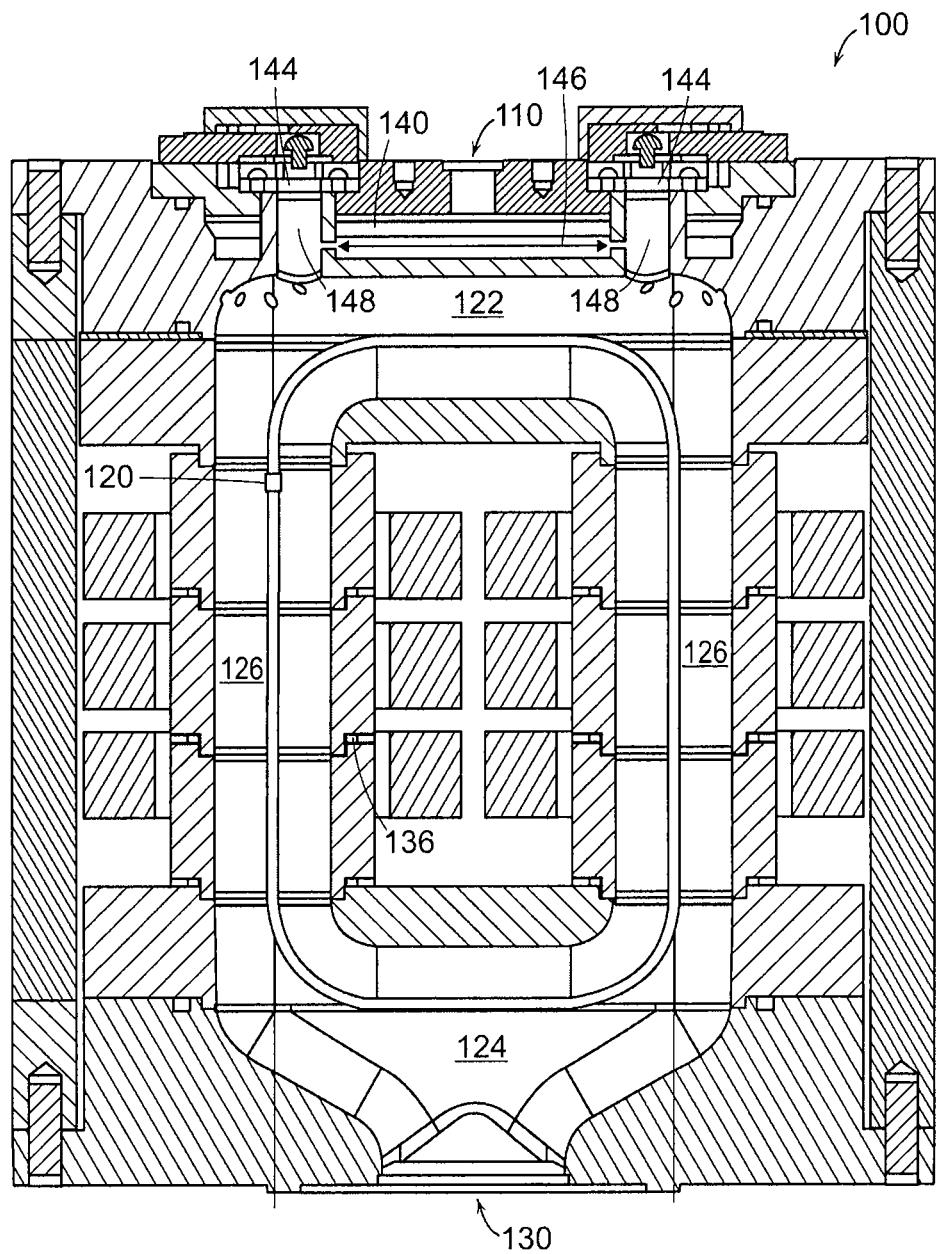
FIG. 3 shows a cross-sectional view of an embodiment of a toroidal plasma chamber.

FIG. 1 is a schematic representation of an embodiment of a toroidal low-field plasma source 10 for producing activated gases. The source 10 includes a power transformer 12 that couples electromagnetic energy into a plasma 14. The power transformer 12 includes a high permeability magnetic core 16, a primary coil 18, and a plasma chamber 20. The plasma chamber 20 allows the plasma 14 to form a secondary circuit of the transformer 12. The power transformer 12 can include additional magnetic cores and conductor coils (not shown) that form additional primary or secondary circuits.

The plasma chamber 20 can be formed from a metallic material such as aluminum or a refractory metal, a coated metal such as anodized aluminum, or can be formed from a dielectric material such as quartz. One or more sides of the plasma chamber 20 can be exposed to a process chamber 22 to allow charged particles generated by the plasma 14 to be in direct contact with a material to be processed (not shown). Alternatively, the plasma chamber 20 can be located at a distance from the process chamber 22, allowing activated neutral gases to flow to the process chamber 22 while charged particles recombine during the gas transport. A sample holder 23 can be positioned in the process chamber 22 to support the material to be processed. The material to be processed can be biased relative to the potential of the plasma.

The plasma source 10 also comprises a switching power supply 50. In one embodiment, the switching power supply 50 includes a voltage supply 24 directly coupled to a switching circuit 26 containing a switching semiconductor device 27. The voltage supply 24 can be a line voltage supply or a bus voltage supply. The switching semiconductor device 27 can be a set of switching transistors. The switching circuit 26 can be a solid state switching circuit. An output 28 of the circuit 26 can be directly coupled to the primary winding 18 of the transformer 12.

The toroidal low field plasma source 10 can include a means for generating free charges that provides an initial ionization event that ignites a plasma in the plasma chamber 20. The initial ionization event can be a short, high voltage pulse that is applied to the plasma chamber. The pulse can have a voltage of approximately 500-10,000 volts and can be approximately 0.1 to 10 microseconds long. A continuous high RF voltage of 500-10,000 volts can also be used to produce the initial ionization event, and the voltage is disconnected after gas breaks down. A noble gas such as argon may be inserted into the plasma chamber 20 to reduce the voltage required to ignite a plasma. Ultraviolet radiation can also be used to generate the free charges in the plasma chamber 20 that provide the initial ionization event that ignites the plasma in the plasma chamber 20.

In one embodiment, the high voltage electric pulse is applied to an electrode 30 positioned in the plasma chamber 20. In another embodiment, the short, high voltage electric pulse is applied directly to the primary coil 18 to provide the initial ionization event. In another embodiment, the short, high voltage electric pulse is applied to an electrode 32 that is capacitively coupled to the plasma chamber 20 by a dielectric. In another embodiment, the plasma chamber 20 is exposed to ultraviolet radiation emitting from an ultraviolet light source 34 that is optically coupled to the plasma chamber 20. The ultraviolet radiation causes the initial ionization event that ignites the plasma.

The toroidal low field plasma source 10 can also include a circuit 36 for measuring electrical parameters of the primary winding 18. Electrical parameters of the primary winding 18 include the current driving the primary winding 18, the voltage across the primary winding 18, the bus or line voltage supply generated by the voltage supply 24, the average power in the primary winding 18, and the peak power in the primary winding 18.

In addition, the plasma source 10 can include a means for measuring relevant electrical parameters of the plasma 14. Relevant electrical parameters of the plasma 14 include the plasma current and power. For example, the source 10 can include a current probe 38 positioned around the plasma chamber 20 to measure the plasma current flowing in secondary of the transformer 12. The plasma source 10 can also include an optical detector 40 for measuring the optical emission from the plasma 14. In addition, the plasma source 10 can include a power control circuit 42 that accepts data from one or more of the current probe 38, the power detector 40, and the circuit 26 and then adjusts the power in the plasma by adjusting the current in the primary winding 18.

In operation, a gas is bled into the plasma chamber 20 until a pressure substantially between 1 millitorr and 100 torr is reached. The gas can comprise a noble gas, a reactive gas or a mixture of at least one noble gas and at least one reactive gas. The circuit 26 containing switching semiconductor devices supplies a current to the primary winding 18 that induces a potential inside the plasma chamber 20. The magnitude of the induced potential depends on the magnetic field produced by the core and the frequency at which the switching semiconductor devices operate according to Faraday's law of induction. An ionization event that forms the plasma can be initiated in the chamber. The ionization event can be the application of a voltage pulse to the electrode 30 in the chamber 20 or to the electrode 32 that is capacitively coupled to the plasma chamber 20. The ionization event can also be the application of a high voltage to the primary winding. Alternatively, the ionization event can be exposing the chamber to ultraviolet radiation.

Once the gas is ionized, a plasma is formed which completes a secondary circuit of the transformer. The electric field of the plasma can be substantially between 1-100 V/cm. If only noble gases are present in the plasma chamber 20, the electric fields in the plasma 14 can be as low as 1 volt/cm. If, however, electronegative gases are present in the chamber, the electric fields in the plasma 14 are considerably higher.

FIG. 2 illustrates an embodiment of a swirl gas mixer plate 60 according to the prior art. The swirl gas mixer plate 60 contains a number of concentric holes 62, which are aligned tangentially to the inner surface of the plasma channel (not shown). In operation, the swirl gas mixer plate 60 injects feed gas helically into the plasma chamber 20, creating a spiral flow and forcing the feed gas to mix and react with the plasma 14. However, the swirl gas mixer plate 60 introduces the gas at a specified location in the plasma channel, leading to erosion at the location due to high impedance created by the gas.

FIG. 3 shows a cross-sectional view of an embodiment of a toroidal plasma chamber 100 for minimizing flow turbulence and flow-induced plasma instabilities, and improving gas-plasma interactions. The toroidal plasma chamber 100 includes a gas inlet 110, a toroidal plasma channel 120, and a gas outlet 130. The plasma chamber is formed with multiple sections and with multiple dielectric breaks 136 along the plasma channel. The dielectric breaks prevent induced electric current from flowing in the plasma chamber, and distributes induced electric voltage uniformly across the multiple dielectric breaks 136 thereby reducing peak electric field in the plasma channel.

The gas inlet 110 includes a buffer or gas plenum 140 for introducing gas into the plasma channel 120 over a broad area to reduce localized high plasma impedance and gas flow instability. The plasma channel 120 include an upper leg 122, a lower leg 124, and two side legs 126 that form a race-track-shaped toroidal plasma topology. A plurality of gas injection holes 142 (better illustrated in FIGS. 5A-5C) generate two separate but coherent gas rotations during gas injection to improve gas-plasma interactions and to maintain flow stability. It should be noted that the gas flow path in the plasma channel 120 is smoothed (e.g., having no sharp corners) to prevent flow turbulence, pressure build-up, or interaction of plasma with the channel walls. In one embodiment, the upper leg 122 includes at least one ignition device 144 for providing an ionization event that forms the plasma. The ignition device 144 may be recessed from the plasma channel to reduce heat from the plasma to the electrode or the dielectric window. There can optionally be a purge hole 146 injecting a fraction of inlet gas into tube section 148 connecting the ignition device 144 and the plasma channel 120 to assist with the ignition of the plasma. The purge hole 146 delivers fresh inlet gas to the ignition device 144 and helps to bring charged particles generated at the ignition device 144 to the plasma channel 120. The gas outlet 130 is substantially larger than the cross-section area of the plasma channel 120 to accommodate a higher amount of gas at the gas outlet 130 due to dissociation of the process gas, and to enable a smooth transition from the toroidal plasma channel to the gas outlet 130.

Figure 4:
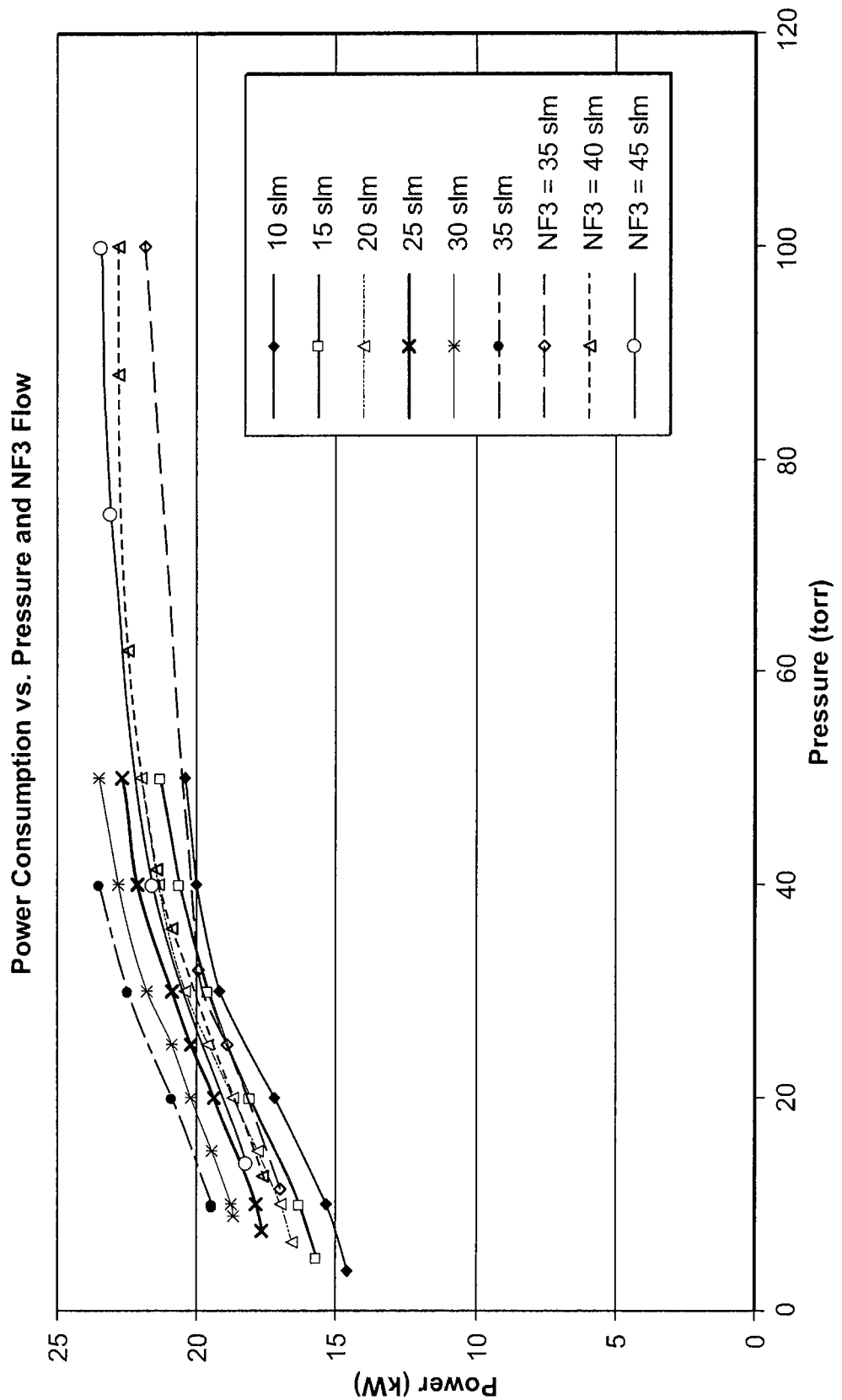
FIG. 4 shows operation data of the plasma source demonstrating its operation at NF3 flow rate of up to 45 slm and at pressure of 100 torr.

FIG. 4 shows operational data of the plasma source 100 (FIG. 3) demonstrating its operation at NF3 flow rate of up to 45 slm and at pressure of 100 torr. As shown, the plasma source 100 can operate at high gas flow rates and can achieve a high gas excitation or a dissociation rate. In one embodiment, the NF3 flow capability of toroidal plasma source 100 can be at least 30 slm or higher.

Figure 5A:
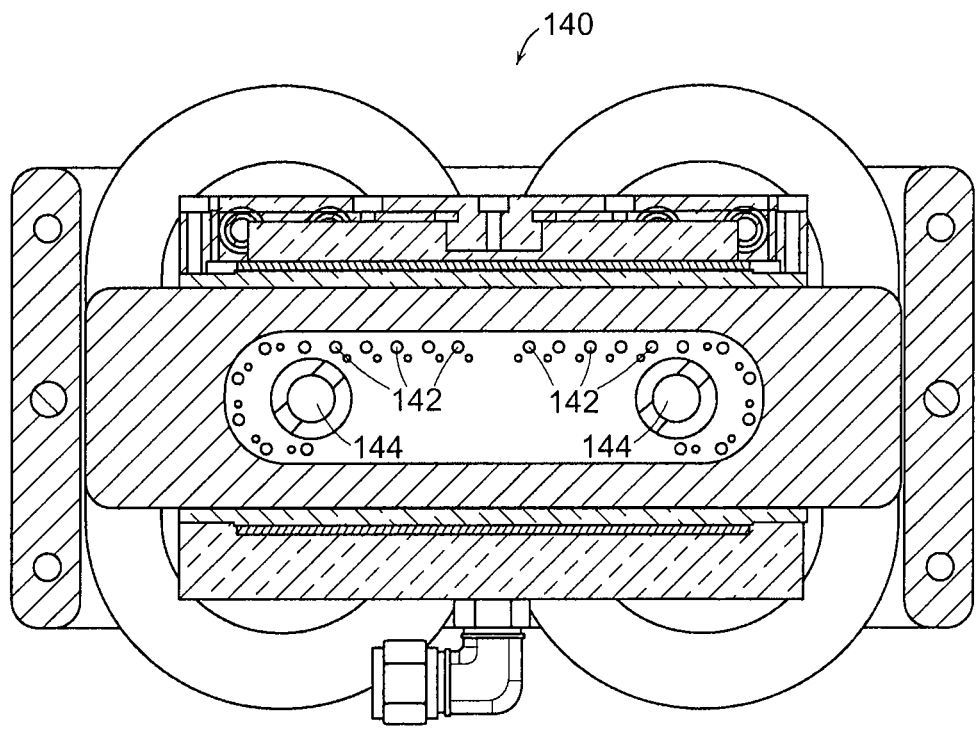
FIG. 5A shows a top view of a gas plenum.
Figure 5B:
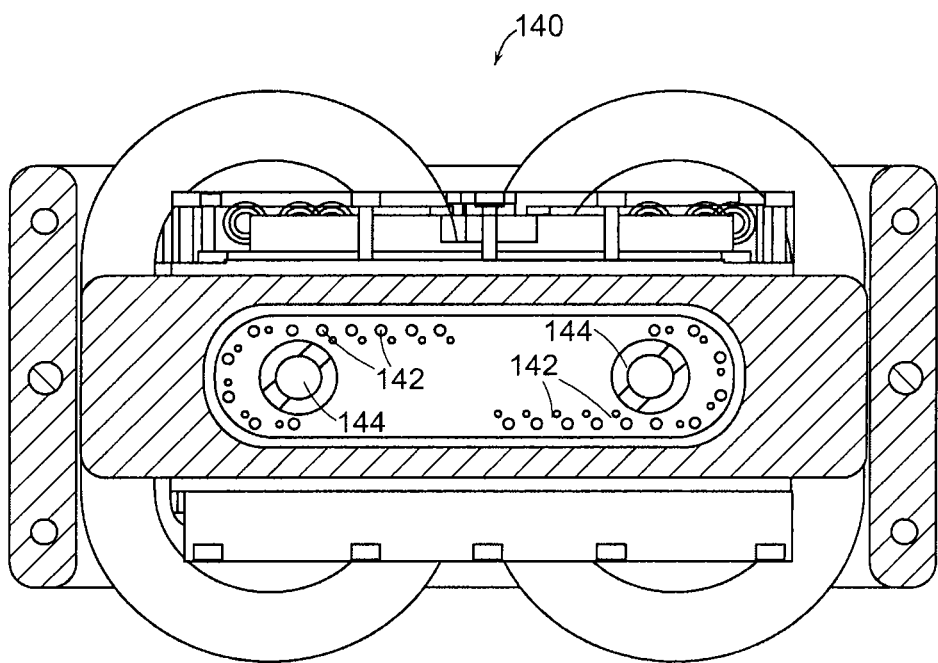
FIG. 5B shows a top view of another embodiment of a gas plenum.
Figure 5C:
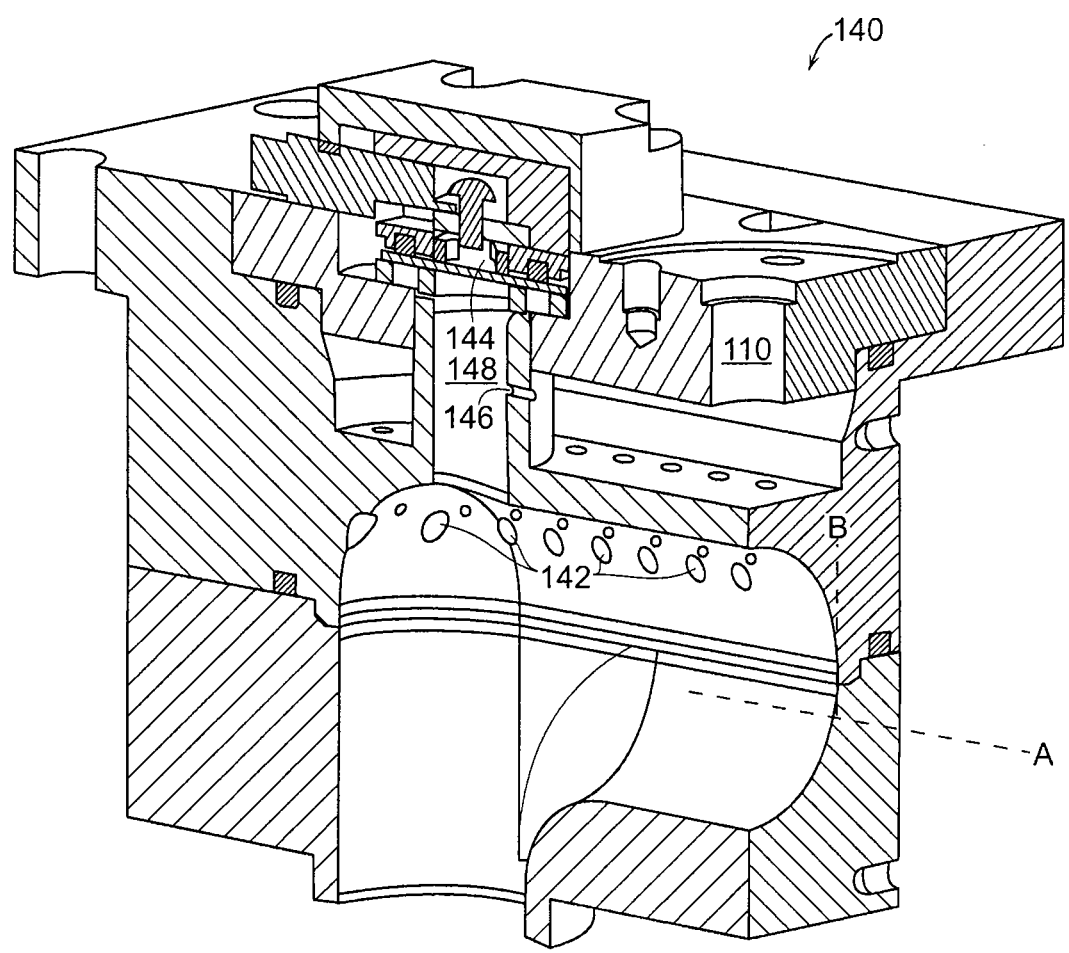
FIG. 5C shows a cross-sectional view of the gas plenum of FIG. 5A or FIG. 5B.
Figure 6B:
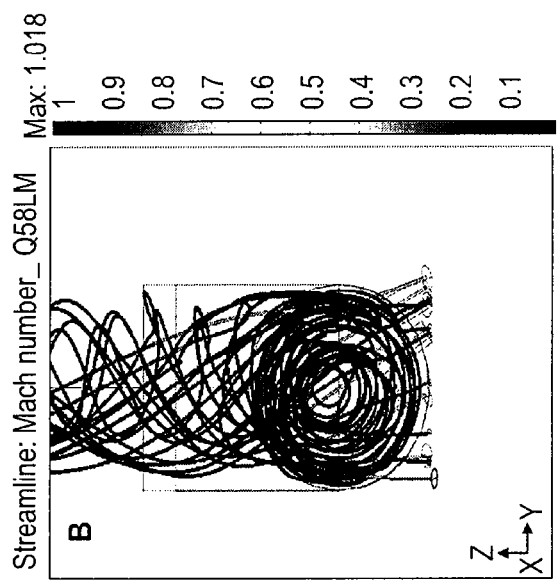
FIG. 6B shows the helical gas rotation in the plasma channel with respect to gas flowing in a vertical direction of FIG. 6A.
Figure 6C:
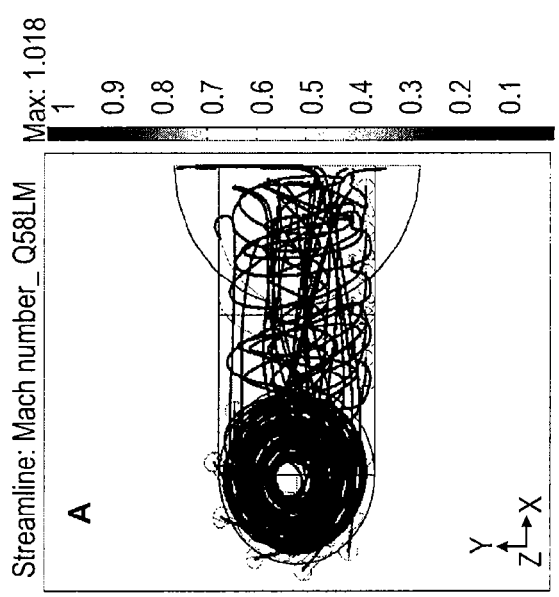
FIG. 6C shows the helical gas rotation in the plasma channel with respect to gas flowing in a horizontal direction of FIG. 6A.
Figure 6A:
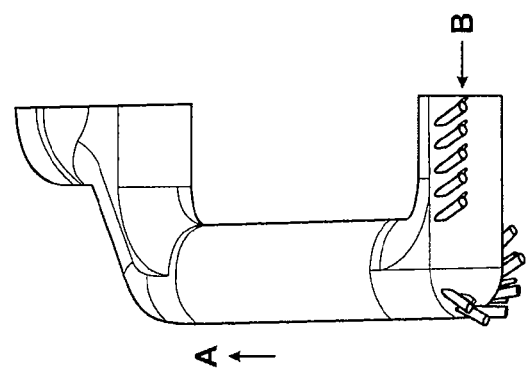
FIG. 6A shows one side of an internal gas volume of the plasma channel.

FIG. 5A and FIG. 5B show top view of two embodiments of the gas plenum 140 (FIG. 3) and FIG. 5C shows a cross-sectional view of the gas plenum 140. The gas plenum 140 includes a plurality of holes 142 for introducing process gas into the plasma channel 120 (FIG. 3). The gas injection holes 142 generate a helical gas rotation in the plasma channel 120. The embodiment of FIG. 5A creates a symmetric rotation pattern in the two halves of the top leg of the plasma channel 120, while the embodiment of FIG. 5B creates an anti-symmetric rotation pattern. FIG. 6A shows one side of an internal gas volume of the plasma channel 120 (FIG. 3). The holes 142 are substantially tangential to the plasma channel 120 inner surfaces and are angled or oriented to generate helical gas rotation in the plasma channel 120. FIG. 6B shows gas trajectories viewed along the axis of a side leg 126 of the plasma channel 120. FIG. 6C shows the gas trajectories viewed along the upper leg of plasma channel 120. The helical gas rotation forces the plasma to the center of the plasma channel, improving plasma stability as well as reducing erosion within the plasma channel 120. The helical gas rotation also improves interaction between the process gas and plasma. The holes 142 are angled between 30 degrees and 90 degrees relative to an axial direction of the plasma channel 120 (generally shown as A), and between 45 degrees and 90 degrees relative to a perpendicular direction (generally shown as B) to the axis of the plasma channel 120. The injection holes 142 are spread over a broad area in the plasma channel 120 to prevent localized concentration of inlet gas and high local plasma impedance. Two separate but coherent gas rotations are introduced during gas injection to improve gas-plasma interactions and to maintain flow stability. The holes 142 are also oriented tangential to the plasma channel surface to avoid pushing the plasma towards the surfaces of the plasma channel 120 by the inlet gas.

Figure 7A:
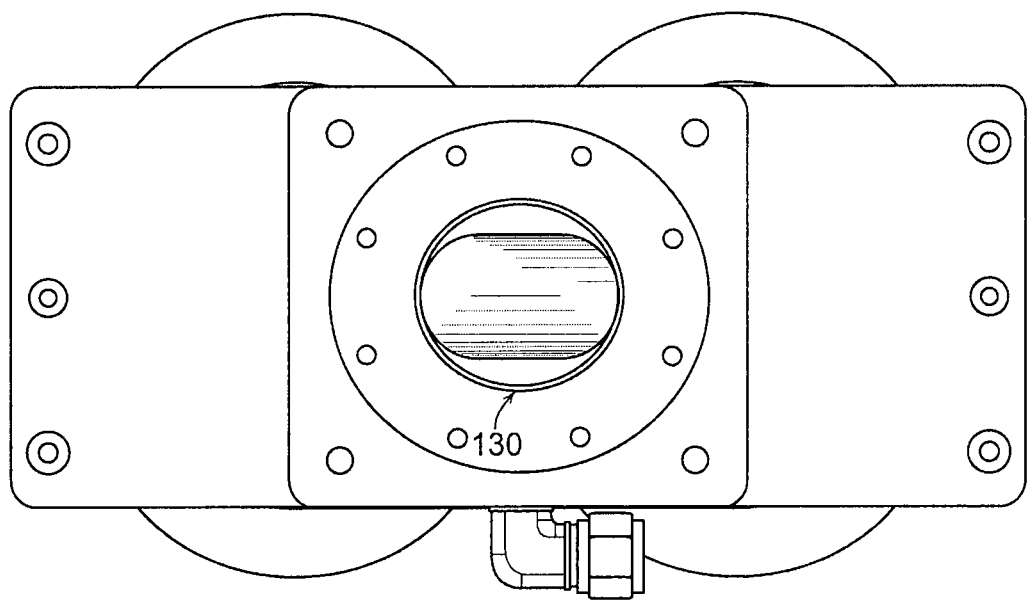
FIG. 7A shows a bottom view of an embodiment of a gas outlet.
Figure 7B:
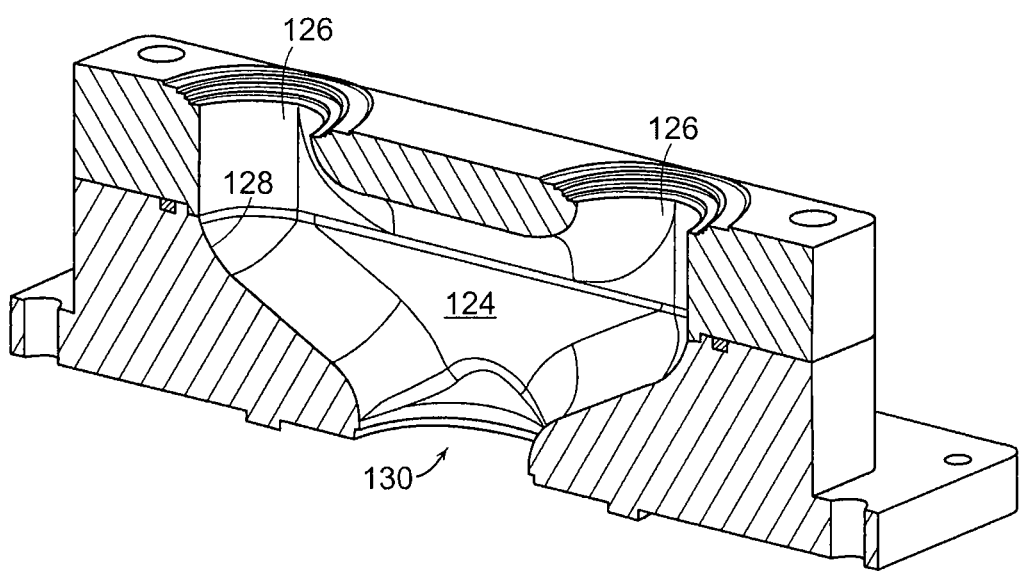
FIG. 7B shows a cross-sectional view of the gas outlet of FIG. 7A.

FIG. 7A shows a bottom view of the gas outlet 130 of the plasma channel 120 (FIG. 3) and FIG. 7B shows a cross-sectional view of the gas outlet 130 of the plasma channel 120. In one embodiment, the cross-section area of the gas outlet 130 is greater than twice the cross-section area of the plasma channel 120 to prevent flow turbulence near the gas outlet 130. In some embodiments, a transition angle 128 between the vertical legs 126 of the plasma channel 120 and the gas outlet 130 is greater than 95 degrees. In some embodiments, the transition angle 128 can range between 100 and 180 degrees for minimizing flow turbulence.

Figure 8A:
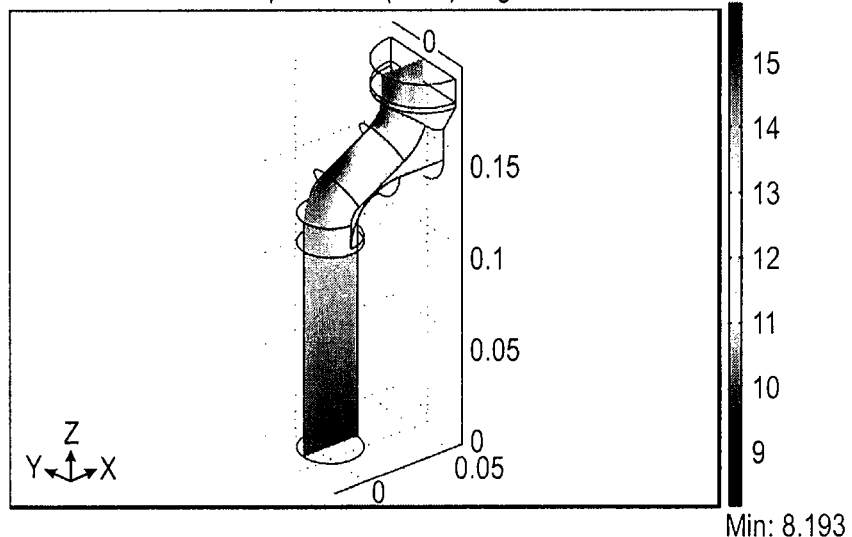
FIG. 8A shows the calculated pressure drop in the plasma source based on a total flow rate of 120 slm at the gas outlet.
Figure 8B:
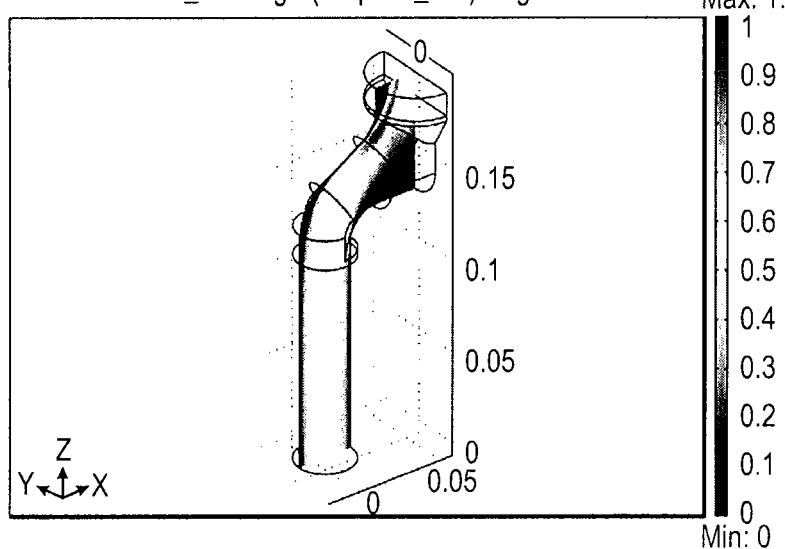
FIG. 8B shows the gas flow speed profile in the plasma source based on a total flow rate of 120 slm at the gas outlet.

FIG. 8A shows the calculated pressure drop in the plasma source 100 (FIG. 3) based on a total flow rate of 120 slm at the gas outlet 130. FIG. 8B shows the gas flow speed profile in the plasma source 100 based on a total flow rate of 120 slm at the gas outlet 130. It should be noted that the highest pressure drop and flow speed occur at the transition section between the plasma channel 120 and the gas outlet 130 thereby illustrating the importance of having a transition angle at between 100 and 180 degrees for minimizing flow turbulence.

Figure 9A:
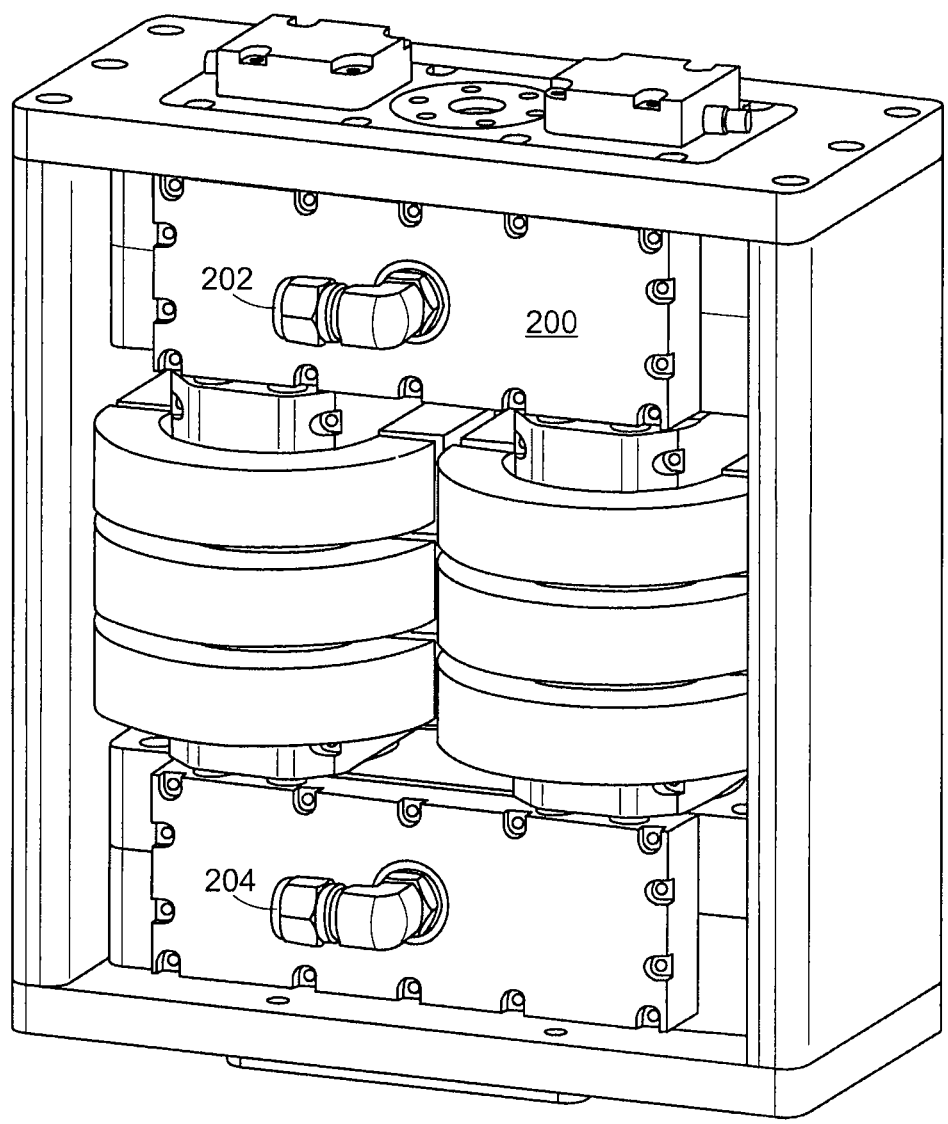
FIG. 9A shows a cooling structure 200 for the toroidal plasma source.
Figure 9B:
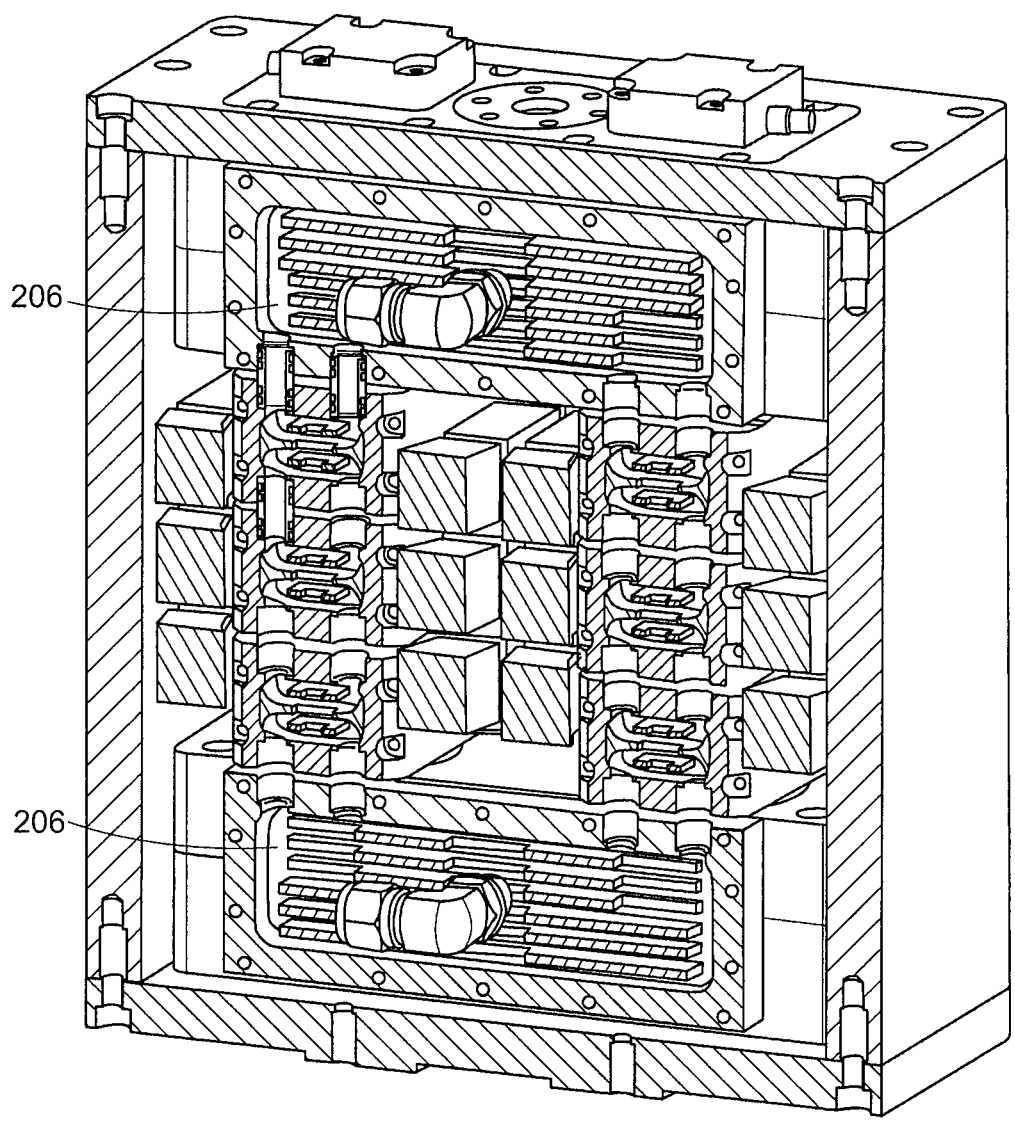
FIG. 9B shows a cross-sectional view of the cooling structure of FIG. 9A.

FIG. 9A shows a cooling structure 200 for the toroidal plasma source 100 (FIG. 3). FIG. 9B shows a cross-sectional view of the cooling structure 200 of FIG. 9A. The cooling structure is symmetric on the two sides of the plasma chamber, and only one side is shown in FIG. 9A and FIG. 9B. The cooling structure 200 includes an inlet tube 202, an outlet tube 204, and a plurality of channels 206. The cooling structure 200 is segmented, similar to the plasma chamber 100, to multiple sections. Individual cooling sections are mounted onto each plasma chamber section along a plasma channel. Dielectric tubes connect the different cooling sections to allow a coolant such as water to flow between the cooling sections. A thermally conductive pad or grease is used for improving thermal conduction from the plasma channel to the cooling structure. In operation, a coolant is forced through the channels 206 to cool the toroidal plasma source 100. The ability to cool the plasma source 100 is beneficial because it reduces the temperature of the plasma chamber, protecting the plasma chamber material and vacuum seals. The ability to cool also allows the plasma source to operate at high power level and high gas flow rate, improving process throughput and reducing process cost.

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein.

What is claimed is:

1. A plasma chamber for use with a reactive gas source, comprising:
   a gas inlet that receives a process gas;
   at least four legs including at least an upper leg and two vertical legs forming a toroidal plasma channel, each leg having a substantially circular cross-sectional area; and
   a plenum above the upper leg and the two vertical legs that introduces the process gas into the plasma channel, the plenum comprising:
   a first group of holes distributed along an elongated portion of the upper leg for introducing the process gas into the plasma channel to provide initial helical gas rotations within the upper leg toward each vertical leg, and
   for each vertical leg, a second group of holes distributed along a portion of the vertical leg for introducing the process gas into the plasma channel to provide a second helical gas rotation within each vertical leg,
   wherein (1) the first group of holes are angled substantially tangential to an inner surface of the upper leg at between 30 degrees and 90 degrees relative to an axial direction of the upper leg and between 45 degrees and 90 degrees relative to a direction perpendicular to the axial direction and (2) the second group of holes are angled substantially tangential to an inner surface of respective vertical leg at between 30 degrees and 90 degrees relative to the axial direction and between 45 degrees and 90 degrees relative to the perpendicular direction, the first and second groups of holes are oriented to allow the second helical gas rotation within each vertical leg to coherently merge with the initial gas rotations.

2. The plasma chamber of claim 1, further comprising:
   at least one ignition device along the upper leg of the plasma channel.

3. The plasma chamber of claim 2, wherein the ignition device is recessed from a plasma channel surface and includes a purge hole that assists igniting the plasma.

4. The plasma chamber of claim 1, wherein the legs of the plasma channel are smoothed, the smoothed legs preventing interaction of plasma with walls of the plasma channel.

5. The plasma chamber of claim 1, wherein an NF3 flow capability of the plasma chamber is at least 30 slm.

6. The plasma chamber of claim 1, further comprising:
   an outlet formed on one of the four legs, the outlet having a greater cross-sectional area than the cross-sectional area of the other legs.

7. The plasma chamber of claim 6, wherein a transition angle between each vertical leg of the plasma channel and the outlet is greater than 95 degrees.

8. The plasma chamber of claim 7, wherein the transition angle is between 100 and 180 degrees.

9. An apparatus for introducing a process gas to a plasma chamber, comprising:
   an inlet that receives the process gas;

a toroidal plasma chamber including at least an upper leg and two vertical legs, each leg having a substantially circular cross-sectional area; and a plenum that introduces the process gas to a plasma channel, the plenum comprising:

a first group of holes distributed along an elongated portion of the upper leg for introducing the process gas into the plasma channel to provide initial helical gas rotations within the upper leg toward each vertical leg, and for each vertical leg, a second group of holes distributed along a portion of the vertical leg for introducing the process gas into the plasma channel to provide a second helical gas rotation within each vertical leg, wherein (1) the first group of holes are angled substantially tangential to an inner surface of the upper leg at between 30 degrees and 90 degrees relative to an axial direction of the upper leg and between 45 degrees and 90 degrees relative to a direction perpendicular to the axial direction and (2) the second group of holes are angled substantially tangential to an inner surface of respective vertical leg at between 30 degrees and 90 degrees relative to the axial direction and between 45 degrees and 90 degrees relative to the perpendicular direction, the first and second groups of holes are oriented to allow the second helical gas rotation within each vertical leg to coherently merge with the initial gas rotations.

10. The apparatus of claim 9, further comprising:
at least one ignition device along the upper leg of the plasma channel and recessed from a plasma channel surface, the ignition device including a purge hole that assists igniting the plasma.

11. A plasma chamber for use with a reactive gas source, comprising:
at least four legs including at least an upper leg and two vertical legs forming a toroidal plasma channel, each leg having a substantially circular cross-sectional area; and means for introducing a process gas into the plasma channel, said means comprising:

a first group of holes distributed along an elongated portion of the upper leg for introducing the process gas into the plasma channel to provide initial helical gas rotations within the upper leg toward each vertical leg, and for each vertical leg, a second group of holes distributed along a portion of the vertical leg for introducing the process gas into the plasma channel to provide a second helical gas rotation within each vertical leg, wherein (1) the first group of holes are angled substantially tangential to an inner surface of the upper leg at between 30 degrees and 90 degrees relative to an axial direction of the upper leg and between 45 degrees and 90 degrees relative to a direction perpendicular to the axial direction and (2) the second group of holes are angled substantially tangential to an inner surface of respective vertical leg at between 30 degrees and 90 degrees relative to the axial direction and between 45 degrees and 90 degrees relative to the perpendicular direction, the first and second groups of holes are oriented to allow the second helical gas rotation within each vertical leg to coherently merge with the initial gas rotations.

12. The plasma chamber of claim 11, further comprising:
an outlet formed on one of the four legs, the outlet having a greater cross-sectional area than the cross-sectional area of the other legs.

13. The plasma chamber of claim 11, further comprising:
means for igniting the plasma along the upper leg of the plasma channel and recessed from a plasma channel surface, said means for igniting including:
a purge hole that assists igniting the plasma.

* * * * *